United States Patent
Kusaka

(10) Patent No.: US 10,772,181 B2
(45) Date of Patent: Sep. 8, 2020

(54) PLASMA GENERATION DEVICE

(71) Applicant: FUJI CORPORATION, Chiryu (JP)

(72) Inventor: Wataru Kusaka, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/495,154

(22) PCT Filed: Mar. 31, 2017

(86) PCT No.: PCT/JP2017/013679
§ 371 (c)(1),
(2) Date: Sep. 18, 2019

(87) PCT Pub. No.: WO2018/179362
PCT Pub. Date: Oct. 4, 2018

(65) Prior Publication Data
US 2020/0029413 A1    Jan. 23, 2020

(51) Int. Cl.
*H05H 1/24* (2006.01)
(52) U.S. Cl.
CPC .................. *H05H 1/24* (2013.01)
(58) Field of Classification Search
CPC .............. H01J 37/3244; H01J 37/3436; H01J 37/32449; H01J 37/32532; H01J 37/32889
See application file for complete search history.

(56) References Cited

U.S. PATENT DOCUMENTS 5,414,237 A    5/1995    Carkhuff
5,534,069 A *  7/1996    Kuwabara .............. B01D 53/72
                                                   118/715

(Continued)

FOREIGN PATENT DOCUMENTS

JP    2007-188689 A    7/2007
JP    2007-188690 A    7/2007

(Continued)

OTHER PUBLICATIONS

Translation of JP 2007188690. (author Masashi et al.) (Year: 2007).*

(Continued)

*Primary Examiner* — Amy Cohen Johnson
*Assistant Examiner* — Syed M Kaiser
(74) *Attorney, Agent, or Firm* — Oblon, McClelland, Maier & Neustadt, L.L.P.

(57) ABSTRACT

A plasma generation device including an electric power supply device to supply electric power to multiple electrodes arranged in a reaction chamber; a processing gas supply device to supply a processing gas to the reaction chamber; and a control device to control operation of the electric power supply device and the processing gas supply device in either of a first operation mode in which, when a stop signal is received while electric power is being supplied to the electrodes in a state with the processing gas being supplied to the reaction chamber, supply of electric power to the electrodes is stopped and supply of the processing gas to the reaction chamber is stopped, and a second operation mode in which supply of electric power to the electrodes is stopped, but the processing gas continues to be supplied to the reaction chamber.

7 Claims, 12 Drawing Sheets

(56) References Cited

U.S. PATENT DOCUMENTS

| | | | |
|---|---|---|---|
| 5,863,706 A * | 1/1999 | Komatsu | C23C 16/047 430/313 |
| 2003/0160031 A1 | 8/2003 | Jones et al. | |
| 2003/0164359 A1 | 9/2003 | Norris et al. | |
| 2005/0019578 A1 * | 1/2005 | Bosteels | B01D 53/9431 428/408 |
| 2006/0163500 A1 * | 7/2006 | Inoue | H05G 2/001 250/493.1 |
| 2007/0220873 A1 * | 9/2007 | Bosteels | F01N 3/10 60/299 |
| 2009/0098710 A1 * | 4/2009 | Yamazaki | H01L 21/268 438/458 |
| 2009/0170345 A1 * | 7/2009 | Akae | H01L 21/0214 438/786 |
| 2010/0093111 A1 * | 4/2010 | Inoue | C23C 16/52 438/5 |
| 2010/0096084 A1 * | 4/2010 | Lee | H01L 21/67069 156/345.33 |
| 2011/0065283 A1 * | 3/2011 | Sato | C23C 16/45557 438/758 |
| 2013/0237064 A1 * | 9/2013 | Kirikihira | H01L 21/67109 438/758 |
| 2014/0287595 A1 * | 9/2014 | Shimamoto | H01L 21/02274 438/774 |
| 2014/0332087 A1 * | 11/2014 | Godes | F17D 3/03 137/2 |
| 2015/0069911 A1 | 3/2015 | Nettesheim et al. | |
| 2017/0104426 A1 * | 4/2017 | Mills | H02S 40/32 |

FOREIGN PATENT DOCUMENTS

| | | |
|---|---|---|
| JP | 2010-244948 | 10/2010 |
| WO | WO 2006/126339 A1 | 11/2006 |
| WO | WO 2014/188592 A1 | 11/2014 |
| WO | WO 2016/194138 A1 | 12/2016 |

OTHER PUBLICATIONS

International Search Report dated Jun. 6, 2017 in PCT/JP2017/013679 filed on Mar. 31, 2017.

Extended European Search Report dated Feb. 20, 2020, in Patent Application No. 17902625.7, 9 pages.

* cited by examiner

PLASMA GENERATION DEVICE

TECHNICAL FIELD

The present application relates to a plasma generation device for generating a plasma gas by converting a processing gas into plasma.

BACKGROUND ART

In a plasma generation device, a processing gas is supplied to a reaction chamber, and electric power is supplied to multiple electrodes arranged in the reaction chamber. As a result, electrical discharge occurs in the reaction chamber, and the processing gas is converted into plasma, thereby generating plasma gas. Examples of a plasma generation device are disclosed in the patent literature below.

CITATION LIST

Patent Literature

Patent literature 1: JP-A-2007-188689
Patent literature 1: International publication WO2014/188592

BRIEF SUMMARY

Technical Problem

With a plasma generation device, it is desired to perform plasma processing efficiently. Therefore, an object of the present disclosure is to provide a plasma generation device capable of efficiently performing plasma processing.

Solution to Problem

To solve the above problems, disclosed herein is a plasma generation device including: an electric power supply device configured to supply electric power to multiple electrodes arranged in a reaction chamber; a processing gas supply device configured to supply a processing gas to the reaction chamber; and a control device configured to control operation of the electric power supply device and the processing gas supply device, wherein the control device is configured to control operation of the processing gas supply device and the electric power supply device in either of a first operation mode in which, when a stop signal is received while electric power is being supplied to the electrodes in a state with the processing gas being supplied to the reaction chamber, supply of electric power to the electrodes is stopped and supply of the processing gas to the reaction chamber is stopped, and a second operation mode in which supply of electric power to the electrodes is stopped, but the processing gas continues to be supplied to the reaction chamber.

Advantageous Effects

According to the present disclosure, since the processing gas continues to be supplied to the reaction chamber when the stop signal is received, that is, when the stop button is operated, plasma processing can be performed immediately, such that plasma processing is efficiently performed.

DESCRIPTION OF EMBODIMENTS

The following describes in detail referring to the figures an example embodiment of the present disclosure.

Configuration of Atmospheric Pressure Plasma Generation Device

Figure 1:
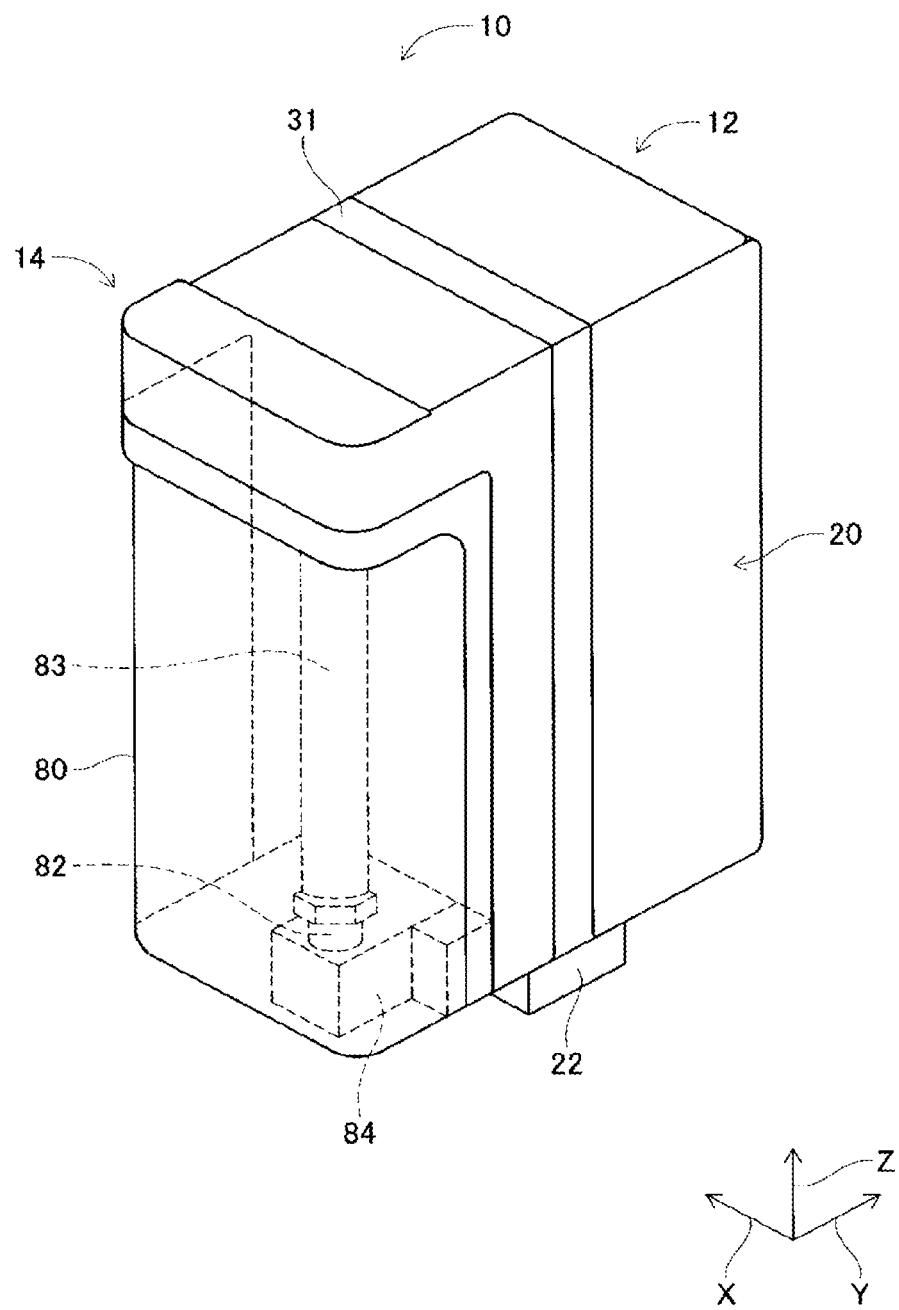
FIG. 1 is a perspective view of an atmospheric pressure plasma generation device.
Figure 2:
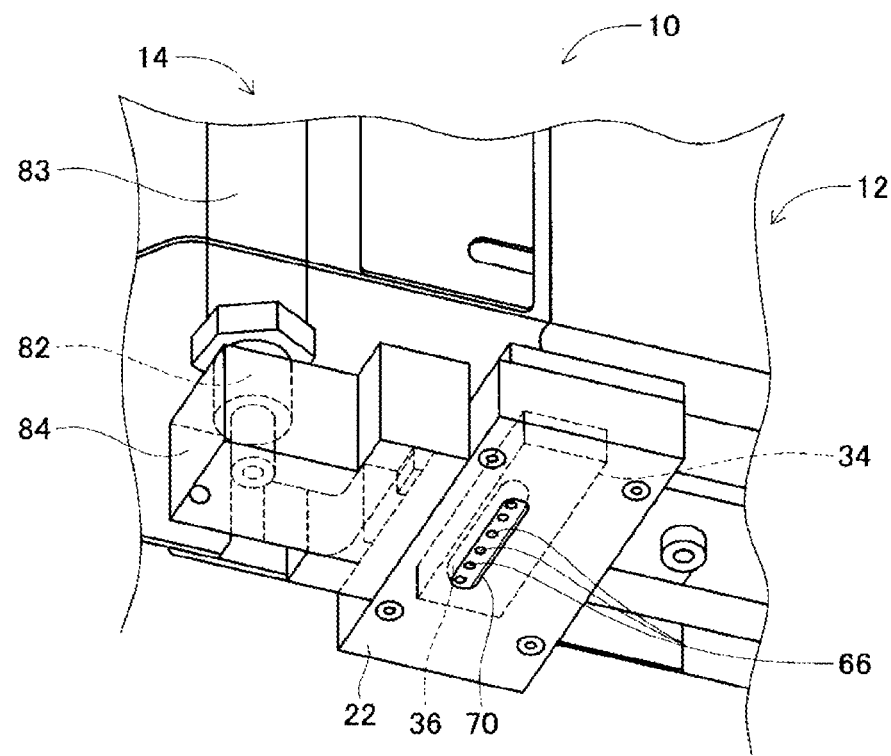
FIG. 2 is a perspective view of a lower end section of the atmospheric pressure plasma generation device.
Figure 3:
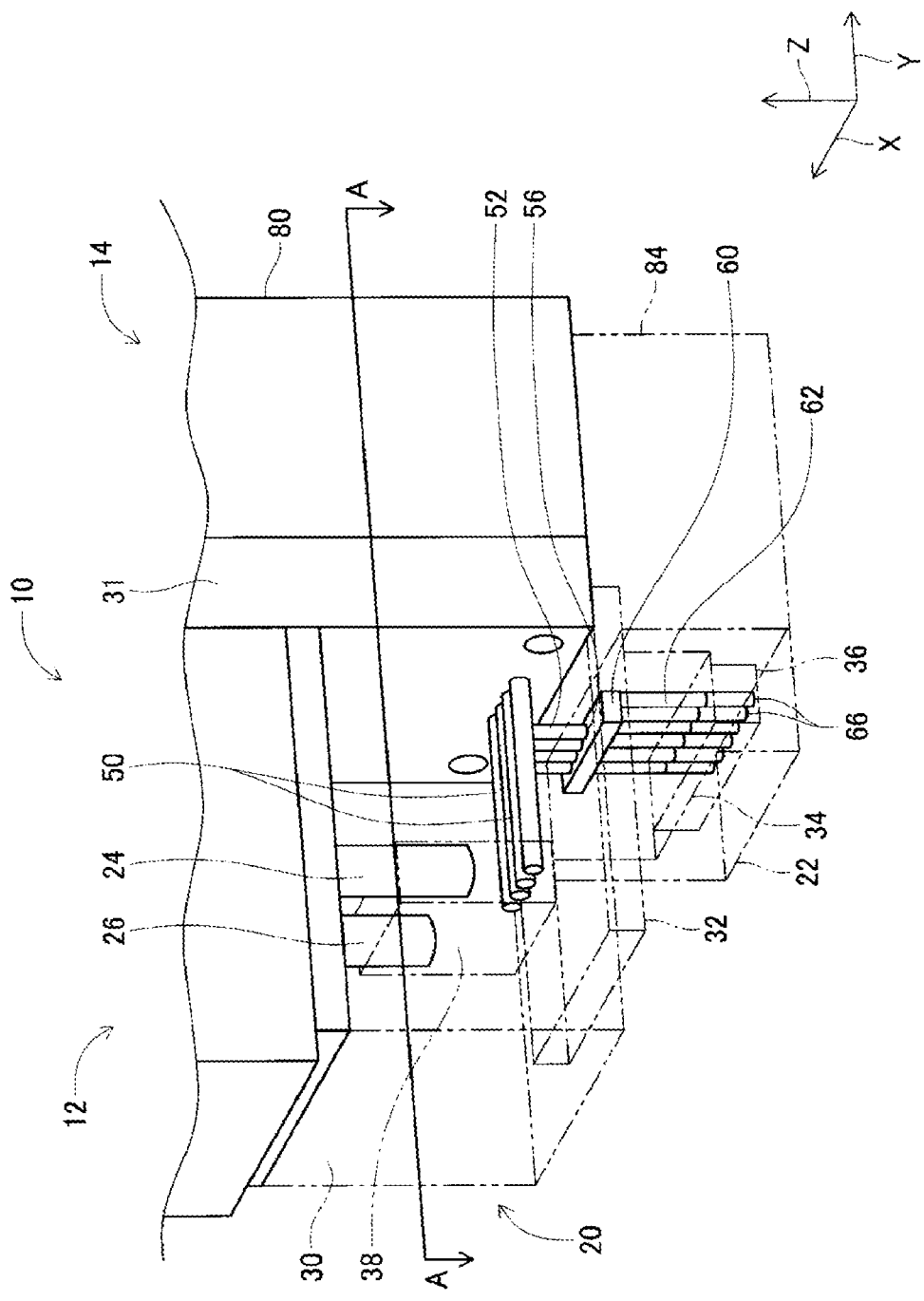
FIG. 3 is a transparent view of a lower end section of the atmospheric pressure plasma generation device.
Figure 4:
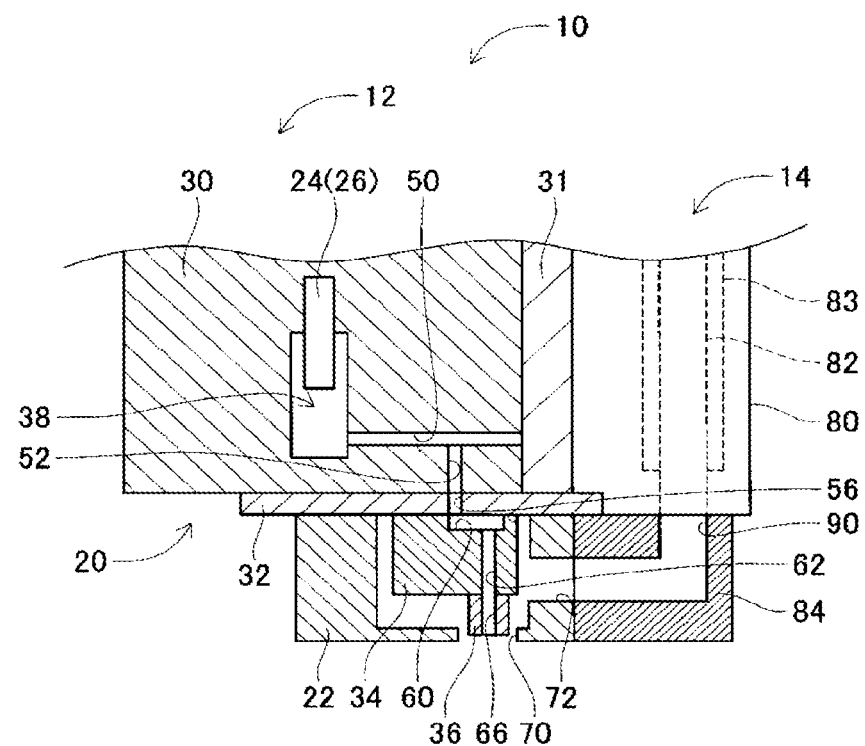
FIG. 4 is a cross section view at line A-A of FIG. 3.

FIGS. 1 to 4 show an embodiment of the present disclosure, atmospheric plasma generation device 10. Atmospheric pressure plasma generation device 10 is for generating plasma at atmospheric pressure, and is provided with plasma gas emitting device 12, heated gas ejecting device 14, and control device 16 (refer to FIG. 5). FIG. 1 is a perspective view from diagonally above of atmospheric pressure plasma generation device 10 overall. FIG. 2 is a perspective view of a lower end section of atmospheric pressure plasma generation device 10 from diagonally below. FIG. 3 is a perspective view of a lower end section of atmospheric pressure plasma generation device 10 from diagonally above. FIG. 4 is a cross section of line AA shown in FIG. 3. Further, a width direction of atmospheric plasma generation device 10 is an X direction, a lengthwise direction of atmospheric plasma generation device 10 is a Y direction, and a direction perpendicular to the X and Y directions, that is, a vertical direction, is a Z direction.

Plasma gas emitting device 12 is configured from housing 20, cover 22, and pair of electrodes 24 and 26. Housing 20 includes main housing 30, heat dissipation plate 31, earth plate 32, lower section housing 34, and nozzle block 36. Main housing 30 is roughly block-shaped, and reaction chamber 38 is formed inside main housing 30. Also, four first gas passages 50 are formed in main housing 30 extending in the Y direction, and these four first gas passages 50 are lined up in the X direction at specified intervals. An end section of each of the first gas passages 50 opens into reaction chamber 38, and the other end of first gas passages 50 opens at a side surface of main housing 30. Further, corresponding to the four first gas passages 50, four second gas passages 52 are formed in main housing 30 extending in the Z direction. The upper end sections of each of the second gas passages 52 open to the corresponding first gas passages 50, and the lower end sections of each of the second gas passages 52 open to the bottom surface of main housing 30.

Heat dissipation plate 31 is arranged on a side surface of main housing 30 at which the first gas passages 50 open, and covers the openings to the side surface of the first gas passages 50. Heat dissipation plate 31 includes multiple fins (not shown) that dissipate heat of main housing 30. Also, earth plate 32 functions as a grounding rod and is fixed to a lower surface of main housing 30. Four through-holes 56 are formed in earth plate 32 in a vertical direction corresponding to the four second gas passages 52, and each through-hole 56 is connected to a corresponding second gas passage 52.

Lower section housing 34 is block-shaped and is fixed to a lower surface of earth plate 32. Recess 60 is formed extending in the X direction in an upper surface of lower section housing 34, and recess 60 faces the four through-holes 56 of earth plate 32. Also, six third gas passages 62 are formed extending in the Z direction in lower section housing 34, and the six third gas passages 62 are lined up in the X direction at specified intervals. The upper end section of each third gas passage 62 opens to recess 60, and the lower end section of each third gas passage 62 opens to the bottom surface of lower section housing 34. Note that, each through-hole 56 of earth plate 32 faces in the Y direction an end section of recess 60 of lower section housing 34, and third gas passage 62 of lower section housing 34 opens at the other end of recess 60 in the Y direction.

Nozzle block 36 is fixed to a lower surface of lower section housing 34, and corresponding to the six third gas passages 62 of lower section housing 34, six fourth gas passages 66 are formed in the Z direction in nozzle block 36. The upper end section of each fourth gas passage 66 is connected to the corresponding third gas passage 62, and the lower end section of each fourth gas passage 66 opens at the lower surface of nozzle block 36.

Cover 22 is roughly square, and is arranged at the lower surface of earth plate 32 so as to cover lower section housing 34 and nozzle block 36. Through-hole 70 is formed in a lower surface of cover 22. Through-hole 70 is larger than the lower surface of nozzle block 36, and the lower surface of nozzle block 36 is positioned inside through-hole 70. Also, through-hole 72 is formed extending in the Y direction in a side surface of cover 22 towards heated gas ejecting device 14.

Pair of electrodes 24 and 26 are arranged facing each other inside reaction chamber 38 of main housing 30. The pair of electrodes 24 and 25 are connected to electric power supply device 73 (refer to FIG. 5) and electric power is supplied from electric power supply device 73. Further, processing gas supply device 74 (refer to FIG. 5) is connected to reaction chamber 38. Processing gas supply device 74 includes inert gas supply device 76 (refer to FIG. 5) and active gas supply device 78 (refer to FIG. 5). Inert gas supply device 76 is a device for supplying an inert gas such as nitrogen as a processing gas at a freely variable flow rate (L/min). Active gas supply device 78 is a device for supplying an active gas such as oxygen as a processing gas at a freely variable flow rate (L/min). As a result, the inert gas and the active gas are separately supplied to reaction chamber 38.

Heated gas ejecting device 14 includes protective cover 80, gas tube 82, heater 83, and connecting block 84. Protective cover 80 is arranged to cover heat dissipation plate 31 of plasma gas emitting device 12. Gas tube 82 is arranged extending in the Z direction inside protective cover 80, and heating-use gas supply device 86 (refer to FIG. 5) is connected to gas tube 82. Heating-use gas supply device 86 is a device for supplying an active gas such as oxygen or an inert gas such as nitrogen at a freely variable flow rate (L/min). Further, roughly ring-shaped heater 83 is arranged on an outer circumferential surface of gas tube 82 and gas tube 82 is heated by heater 83. As a result, gas supplied to gas tube 82 from heating-use gas supply device 86 is heated.

Connecting block 84 is connected to the lower end of gas tube 82, and is fixed to a side surface of cover 22 in the Y direction towards heated gas ejecting device 14. Connecting passage 90 that is roughly L-shaped is formed in connecting block 84, and one end section of connecting passage 90 opens at the upper surface of connecting block 84, and the other end section of connecting passage 90 opens at a side surface in the Y direction towards plasma gas emitting device 12. Also, an end section of connecting passage 90 is connected to gas tube 82, and the other end section of connecting passage 90 is connected to through-hole 72 of cover 22.

Figure 5:
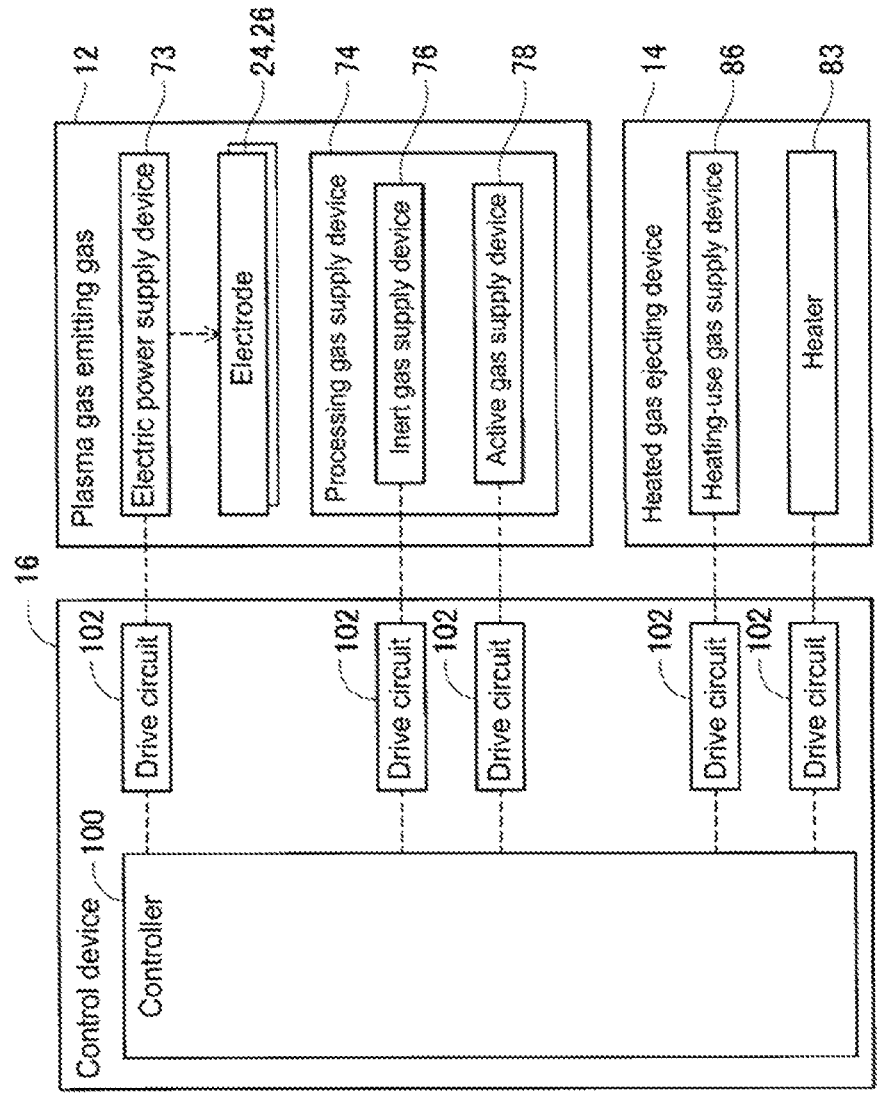
FIG. 5 is a block diagram showing a control device.

Further, as shown in FIG. 5, control device 16 is provided with controller 100 and multiple drive circuits 102. The multiple drive circuits 102 are connected to electric power supply device 73, inert gas supply device 76, active gas supply device 78, heater 83, and heating-use gas supply device 86. Controller 100 is provided with a CPU, ROM, RAM, and so on, is formed mainly from a computer, and is connected to the multiple drive circuits 102. As a result, operation of plasma gas emitting device 12 and heated gas ejecting device 14 are controlled by controller 100.

Plasma Processing by the Atmospheric Pressure Plasma Generation Device

With atmospheric pressure plasma generation device 10, in plasma gas emitting device 12, by electric power being supplied to electrodes 24 and 26 in a state with processing gas being supplied to reaction chamber 38, the processing gas is converted into plasma inside reaction chamber 38. Then, the plasmarized gas, that is, the plasma gas, is ejected from the lower end of fourth gas flow path 66 of nozzle block 36. Also, gas heated by heated gas ejecting device 14 is supplied inside cover 22. As a result, plasma gas is ejected from through-hole 70 of cover 22 together with the heated gas, and the target body is subjected to plasma processing.

Further, with atmospheric pressure plasma generation device 10, it is possible to selectively execute plasma processing in either of a normal mode and a standby mode. In the normal mode, by operating a stop button during plasma processing, supply of electric power to electrodes 24 and 26 is stopped, and supply of processing gas to reaction chamber 38 is stopped. On the other hand, in the standby mode, by operating a stop button during plasma processing, supply of electric power to electrodes 24 and 26 is stopped, but supply of processing gas to reaction chamber 38 is continued.

Therefore, in the normal mode, when plasma processing is restarted after the stop button is operated, that is, when the start button is operated, the processing gas is supplied to the reaction chamber 38. Then, after processing gas has been supplied to reaction chamber 38 to a given degree, that is, after a specified time has elapsed after the operation of the start button, electric power is supplied to electrodes 24 and 26, and plasma gas is generated. On the other hand, in the standby mode, even when the stop button is operated, because processing gas continues to be supplied, simultaneously with the restarting of plasma processing, that is, when the start button is operated, electric power is supplied to electrodes 24 and 26, and plasma gas is generated. As a result, in the standby mode, it is possible to execute the plasma processing quickly, and in the normal mode, it is possible to curtail the consumption of processing gas. Hereinafter, plasma processing by atmospheric pressure plasma generation device 10 in each of the normal mode and the standby mode will be described in detail.

Atmospheric pressure plasma generation device 10 has a selection button for selecting either the normal mode of operation or the standby mode, and the selection button is operated to input the operation signal to the controller 100. Further, the operation mode of atmospheric pressure plasma generation device 10 is set to the operation mode corresponding to the operation signal, that is, either the normal mode or the standby mode selected by the operation of the selection button.

Figure 6:
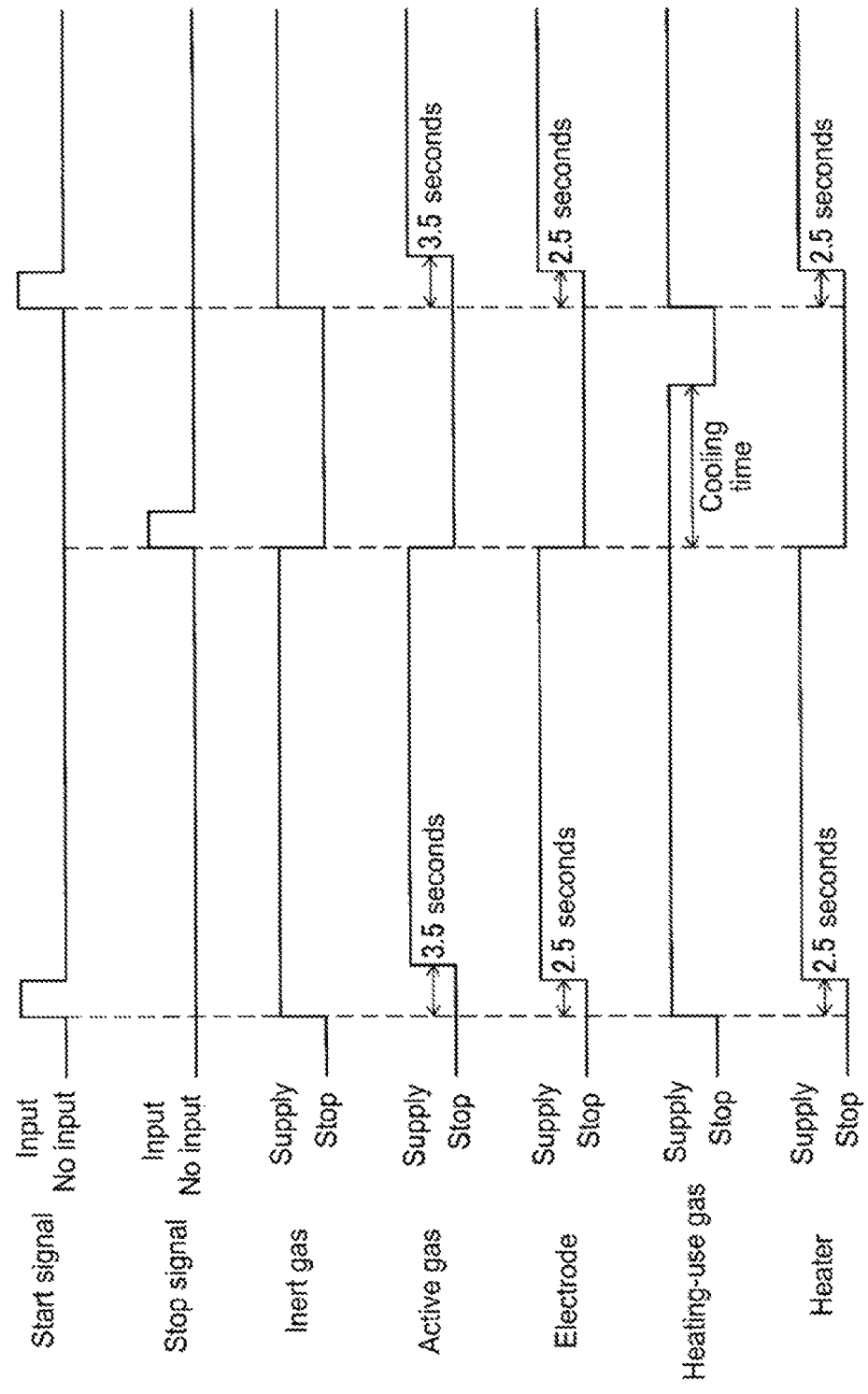
FIG. 6 is a timing chart in normal mode.

Also, with atmospheric pressure plasma generation device 10, a start button and a stop button are provided, and when each of these operation buttons is operated, an operation signal is input to controller 100. Thus, when atmospheric pressure plasma generation device 10 is set to the normal mode, when an operation signal (hereinafter, sometimes referred to as a "start signal") based on the operation of the start button is received by controller 100, as shown in FIG. 6, an inert gas is supplied to reaction chamber 38 by inert gas supply device 76. Also, when the start signal is received by controller 100, heating-use gas is supplied to gas tube 82 the heating-use gas supply device 86. That is, at a time when the start signal is received, inert gas and heating-use gas are supplied.

Next, after a set time, specifically, 2.5 seconds has elapsed from the input of the start signal, voltage, that is, electric power, is applied to electrodes 24 and 26. Thus, in a state with inert gas supplied to a given degree inside reaction chamber 38, an electrical discharge occurs between the pair of electrodes 24 and 26, and the inert gas is plasmarized by the electrical discharge. Also, at a time when the electric power is supplied to electrodes 24 and 26, that is, after a set time, specifically, 2.5 seconds has elapsed after the input of the start signal, heating by heater 83 is started. This makes it possible to heat gas tube 82 in a state in which heating-use gas is supplied to a given degree to gas tube 82, which prevents gas tube 82 from being heated empty.

Further, after a set time, specifically, 3.5 seconds has elapsed after the input of the start signal, that is, one second after the electric power is supplied to electrodes 24 and 26, processing gas is supplied to reaction chamber 38 by processing gas supply device 78. As a result, in reaction chamber 38, not only the inert gas previously supplied but also the active gas is converted into plasma by electrical discharge. That is, by supplying electric power to electrodes 24 and 26 after inert gas is supplied to reaction chamber 38, the inert gas is plasmarized, then, by supplying active gas to reaction chamber 38, inert gas and active gas are plasmarized. This means that plasma gas is generated efficiently.

Also, the plasma gas generated in reaction chamber 38 flows in the Y direction inside first gas flow passage 50, and downwards inside second gas flow passage 52 and through-hole 56. Then, plasma gas flows in recess 60. Further, plasma gas flows in the Y direction inside recess 60, and flows downwards in third gas passage 62 and fourth gas passage 66. Thus, plasma gas is emitted from the lower end of fourth gas passage 66.

Further, with heated gas ejecting device 14, gas tube 82 to which the heating-use gas is supplied is heated by heater 83 such that the gas supplied to gas tube 82 is heated to 600 to 800° C. The heated gas enters inside cover 22 from through-hole 72 of cover 22 via connecting passage 90 of connecting block 84. Then, heated gas that has entered cover 22 is emitted from through-hole 70 of cover 22. Here, plasma gas emitted from the lower end of fourth gas passage 66 of nozzle block 36 is protected by the heated gas. This makes it possible to perform plasma processing appropriately.

Specifically, during plasma processing, a target body to be processed is placed at a position a specified distance from the emission port from which plasma gas is emitted, and the plasma gas is emitted from the emission port onto the target body to be processed. That is, during plasma processing, plasma gas is emitted into the air, and plasma gas emitted into the air is applied to the target body. In this case, plasma gas reacts with active gases in the air such as oxygen, and ozone is generated. This means that there is a problem of the plasma gas deactivating and appropriate plasma processing not being performed.

Thus, with atmospheric pressure plasma generation device 10, gas heated by heated gas ejecting device 14 is ejected into cover 22, and is ejected from through-hole 70 of cover 22. Here, plasma gas emitted from the lower end of nozzle block 36 is protected by the heated gas. Because the heated gas is 600 to 800° C. inside gas tube 82, the heated gas emitted from through-hole 70 is at least 250° C. Because ozone is broken down at temperatures of 200° C. and above, ozonization of the plasma gas covered by the heated gas is prevented. This means that deactivating of the plasma gas is prevented and appropriate plasma processing can be performed.

Also, heated gas of at least 200° C. is emitted towards the target body along with plasma gas, therefore the target body is heated by the processing gas, and plasma processing is performed on the heated target body. Thus, the reactivity of the target body is increased, meaning that plasma processing can be performed effectively.

Further, when the plasma processing on the target body is completed, the operator operates the stop button. Here, when controller 100 receives the operation signal based on the operation of the stop button (also referred to as a "stop signal"), supply of inert gas and active gas is stopped, supply of electric power to electrodes 24 and 26 is stopped, and heating of gas tube 82 by heater 83 is stopped. That is, in normal mode, at a time when the stop signal is received, supply of inert gas and active gas is stopped, supply of electric power to electrodes 24 and 26 is stopped, and heating of gas tube 82 by heater 83 is stopped However, supply of gas by heating-use gas supply device 86 continues even when the stop signal is received, and is only stopped after a set time, specifically, 60 seconds, has elapsed from the receiving of the stop signal. That is, after the set time has elapsed since the stop signal was received, the gas supply by heating-use gas supply device 86 is stopped. This makes it possible to cool gas tube 82 that has been heated to a very high temperature by heater 83 by supplying gas to gas tube 82 for a set time after the heating by heater 83 has stopped. Note that, the set time from the receiving of the stop signal to the stopping of the supply of gas by heating-use gas supply device 86 is also referred to as a cooling time.

Further, in the normal mode, when the start button is operated again after the stop button has been operated, that is, when the start signal is received again after the stop signal has been received, atmospheric pressure plasma generation device 10 operates in the above-described operation mode. That is, at a time when the start signal is received, inert gas and heating-use gas are supplied, and after 2.5 seconds has elapsed from that time, electric power is supplied to electrodes 24 and 26, and gas tube 82 is heated by heater 83. Then, after 3.5 seconds have elapsed from the time at which the start signal was received, active gas is supplied. As a result, the supply of the processing gas and the heating-use gas is stopped during the period from the operation of the stop button to the operation of the start button again, that is, during the period in which plasma processing is not performed, thus allowing consumption of processing gas and heating-use gas to be curtailed.

Figure 7:
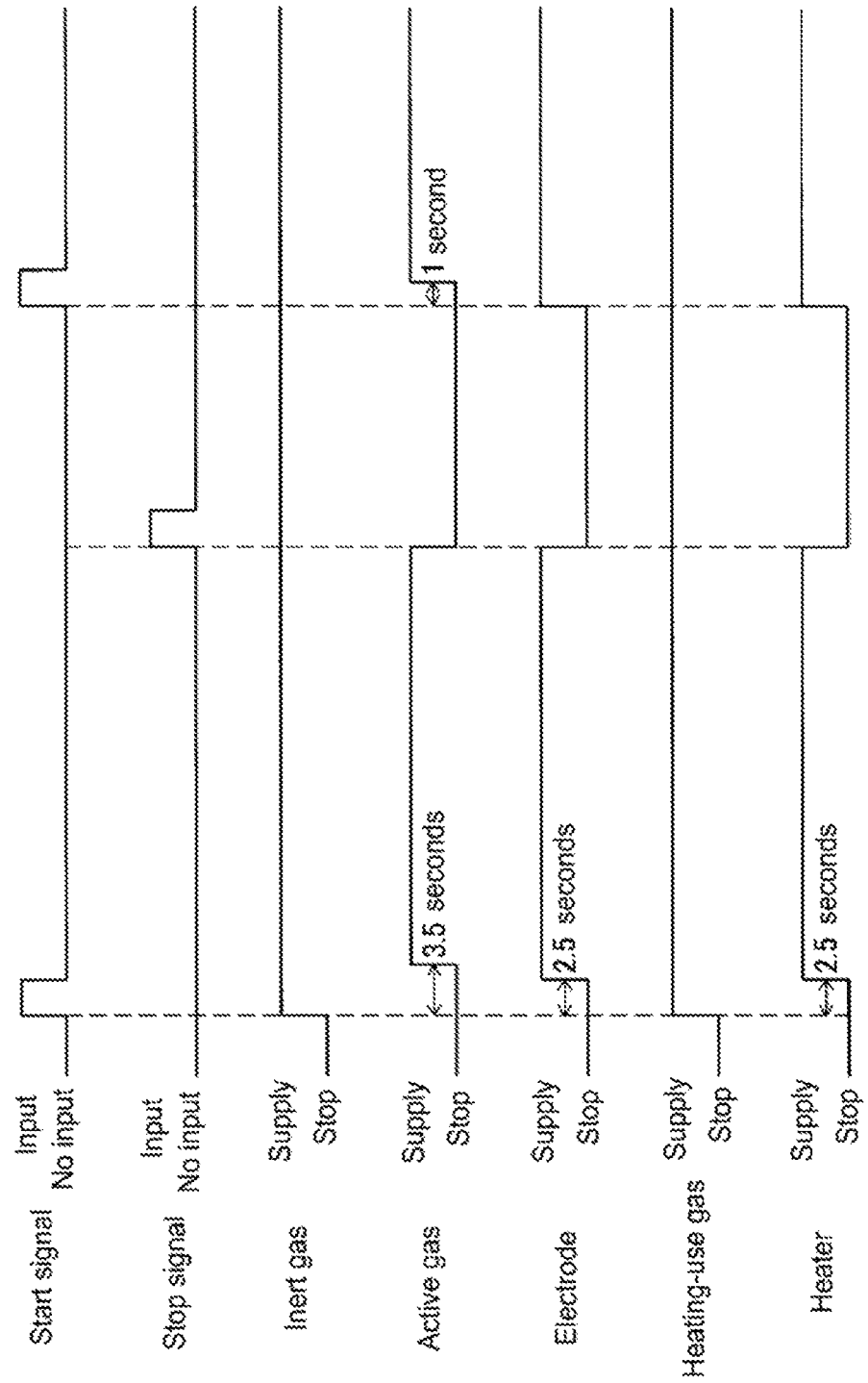
FIG. 7 is a timing chart in standby mode.

On the other hand, when atmospheric pressure plasma generation device 10 is set to the standby mode, when the start signal is received by controller 100 in a state in which processing gas is not being supplied to reaction chamber 38, operation of atmospheric pressure plasma generation device 10 is controlled in the same manner as in the normal mode. That is, as shown in FIG. 7, at a time when the start signal is received, inert gas and heating-use gas are supplied, and after 2.5 seconds has elapsed from that time, electric power is supplied to electrodes 24 and 26, and gas tube 82 is heated by heater 83. Then, after 3.5 seconds have elapsed from the time at which the start signal was received, active gas is supplied.

However, in the standby mode, unlike the normal mode, even when the stop button is operated, the inert gas and the heating gas-use continue to be supplied. Specifically, at a time when controller 100 receives the stop signal, supply of active gas is stopped, supply of electric power to electrodes 24 and 26 is stopped, and heating of gas tube 82 by heater 83 is stopped On the other hand, even if controller 100 receives the stop signal, the supply of the inert gas and the heating-use gas is not stopped, and the inert gas and the heating-use gas continue to be supplied.

Then, after the stop signal is received, with inert gas and heating-use gas continuing to be supplied, if the start button is operated such that controller 100 receives the start signal again, immediately electric power is supplied to electrodes 24 and 26 and gas tube 82 is heated by heater 83. That is, because inert gas continues to be supplied to reaction chamber 38 even when the stop button is operated, at a time when controller 100 receives a start signal, electric power is supplied to electrodes 24 and 26. Further, even if the stop button is operated, since heating-use gas continues to be supplied to gas tube 82, gas tube 82 is heated by heater 83 at the time when the start signal is received by controller 100. Further, active gas is supplied after a set time, specifically, one second, has elapsed from the receiving of the start signal.

That is, in the standby mode, when inert gas continues to be supplied to reaction chamber 38 after the receiving of the stop signal, electrical discharge occurs in reaction chamber 38 at the time when the start button is operated again, and the inert gas is converted into plasma. Then, after one second has elapsed, active gas is supplied to reaction chamber 38, whereby the inert gas and the active gas are converted into plasma in reaction chamber 38. Thus, in the standby mode, plasma gas can be generated immediately after the start button is operated, and plasma processing can be performed promptly.

Further, in the standby mode, when heating-use gas continues to be supplied to gas tube 82 after the receiving of the stop signal, gas tube 82 is heated by heater 83 at a time when the start button is operated again, and the gas is heated in gas tube 82. As a result, the heated gas can be ejected into cover 22 substantially simultaneously with the plasma gas generated immediately after the start button is operated, such that appropriate plasma processing is ensured.

Figure 8:
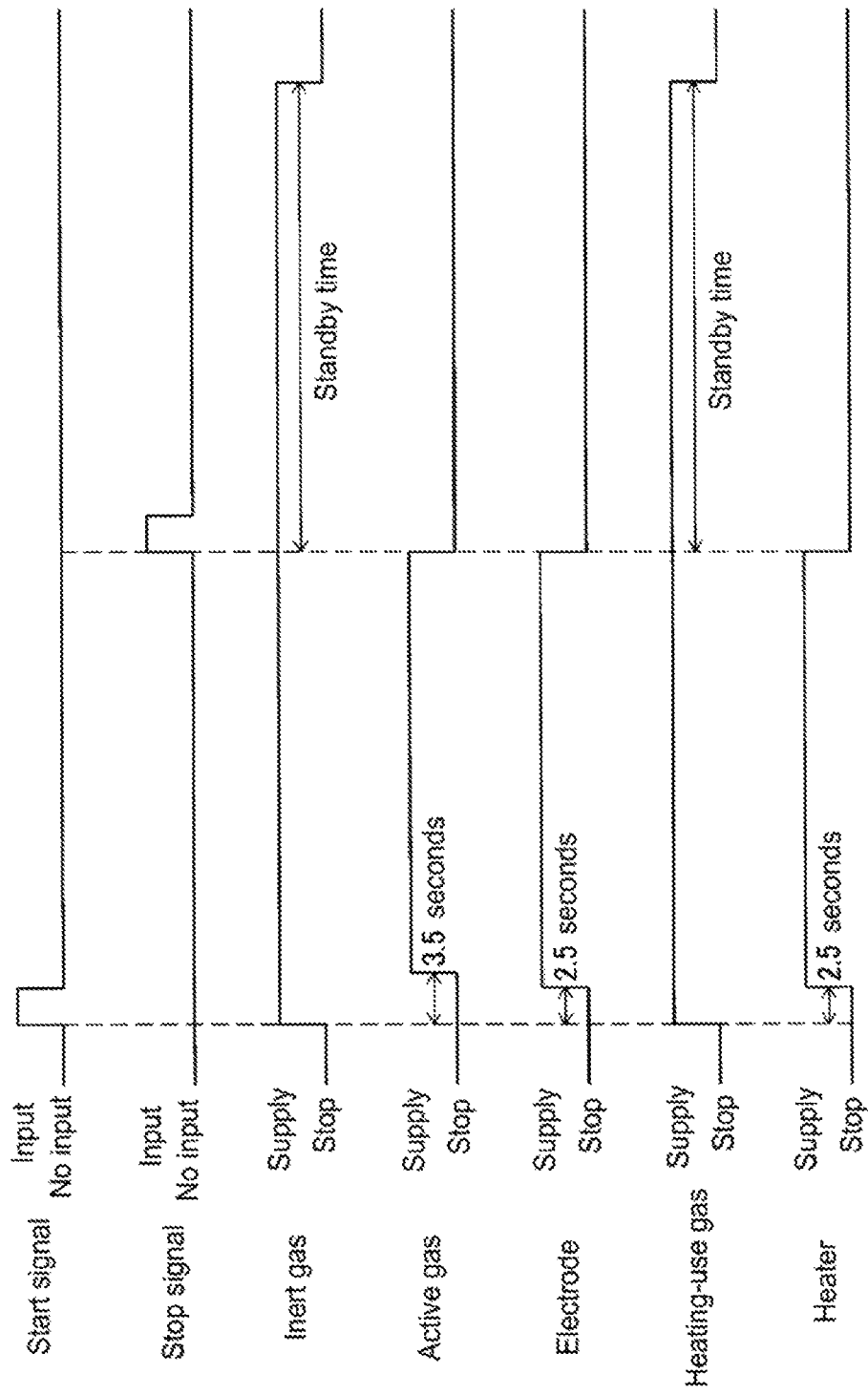
FIG. 8 is a timing chart in standby mode.

However, when atmospheric pressure plasma generation device 10 is set to the standby mode, the start button may not be operated after the stop button is operated. In such a case, the continuously supplied inert gas and heating-use gas are wastefully consumed. Therefore, in atmospheric pressure plasma generation device 10, when a set time elapses without the start button being operated after the stop button has been operated, the supply of inert gas and heating-use gas is stopped. That is, as shown in FIG. 8, when the start signal is not received by controller 100 before the set time elapses after the stop signal is received by controller 100, supply of the inert gas and the heating-use gas is stopped. Therefore, when the start button is not operated after the stop button has been operated, the inert gas and the heating-use gas are continuously supplied for the set time. This makes it possible to curtail wasteful consumption of inert gas and heating-use gas when the start button is not operated for a long time.

Note that, when the start button is not operated after the stop button has been operated, the set time during which the inert gas and the heating gas continue to be supplied is also referred to as a standby time. Further, atmospheric pressure plasma generation device 10 is provided with a setting button for freely setting the standby time. As a result, the operator freely sets the standby time in accordance with the frequency of the plasma processing work or the like, thereby improving the operability in the standby mode.

Further, with atmospheric pressure plasma generation device 10, since it is possible to freely set the standby time, the standby time may be set to a relatively short time. Specifically, for example, the standby time may be set to 50 seconds. In such a case, if the supply of heating-use gas is stopped when the standby time elapses without the start button being operated after the stop button has been operated, there is a worry that gas tube 82 cannot be properly cooled. Specifically, as described above, in the normal mode, after the stop button has been operated to cool the heated gas tube 82, the gas continues to be supplied to gas tube 82 by heating-use gas supply device 86 for a cooling time (60 seconds). The cooling time is set to a time required to properly cool gas tube 82. Therefore, if the gas is supplied to gas tube 82 for a time shorter than the cooling time after the stop button has been operated, gas tube 82 may not be properly cooled.

Figure 9:
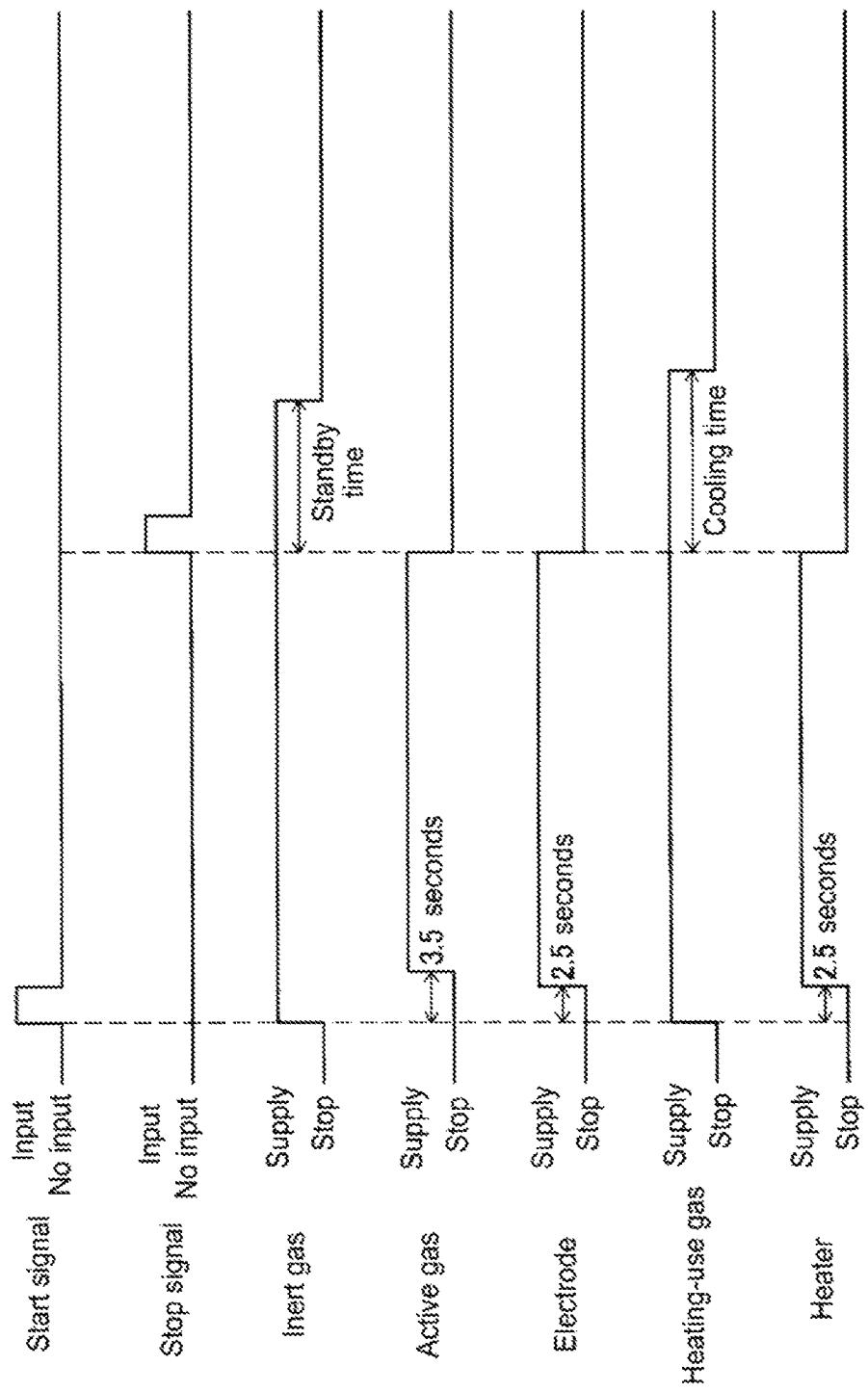
FIG. 9 is a timing chart in standby mode.

Thus, when the standby time is set to a time shorter than the cooling time, as shown in FIG. 9, when the start signal is not received by controller 100 before the standby time elapses after the stop signal is received by controller 100, only the supply of inert gas is stopped. Then, the supply of heating-use gas is stopped at a time when the cooling time has elapsed since the stop signal was received by controller 100. This makes it possible to properly cool gas tube 82.

Figure 10:
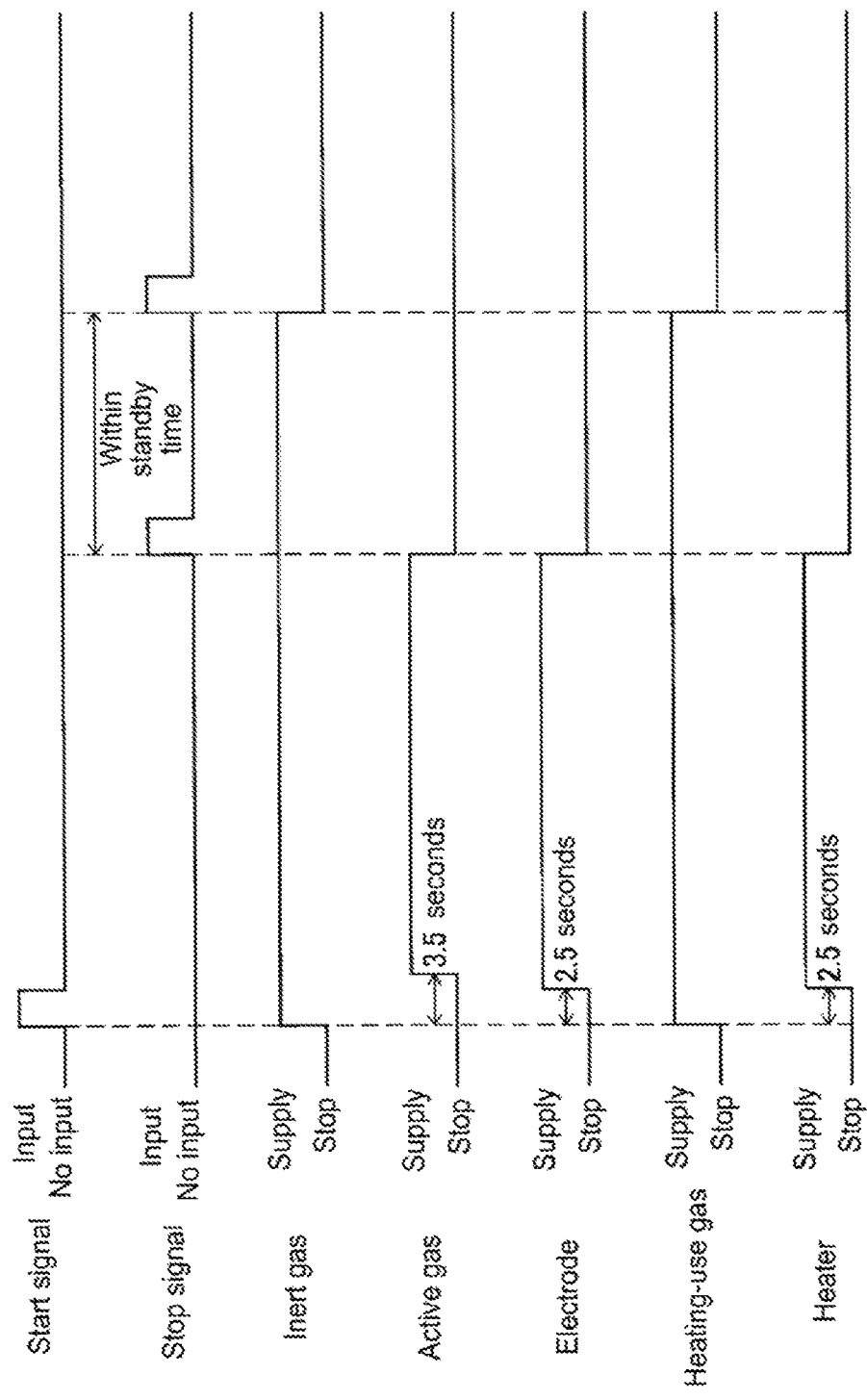
FIG. 10 is a timing chart in standby mode.

In the standby mode, it is also possible to stop the supply of inert gas and heating-use gas without waiting for the elapse of the standby time. Specifically, when the stop button is operated again before the standby time has elapsed after the stop button has been operated, the supply of inert gas and heating-use gas is stopped. That is, as shown in FIG. 10, when the stop signal is received by controller 100 again before the standby time has elapsed after the stop signal is received by controller 100, the supply of inert gas and heating-use gas is stopped. Therefore, for example, when all the operations related to the plasma processing are completed, by operating the stop button twice, the supply of inert gas and heating-use gas can be stopped without waiting for the standby time to elapse. This makes it possible to curtail wasteful consumption of inert gas and heating-use gas.

Figure 11:
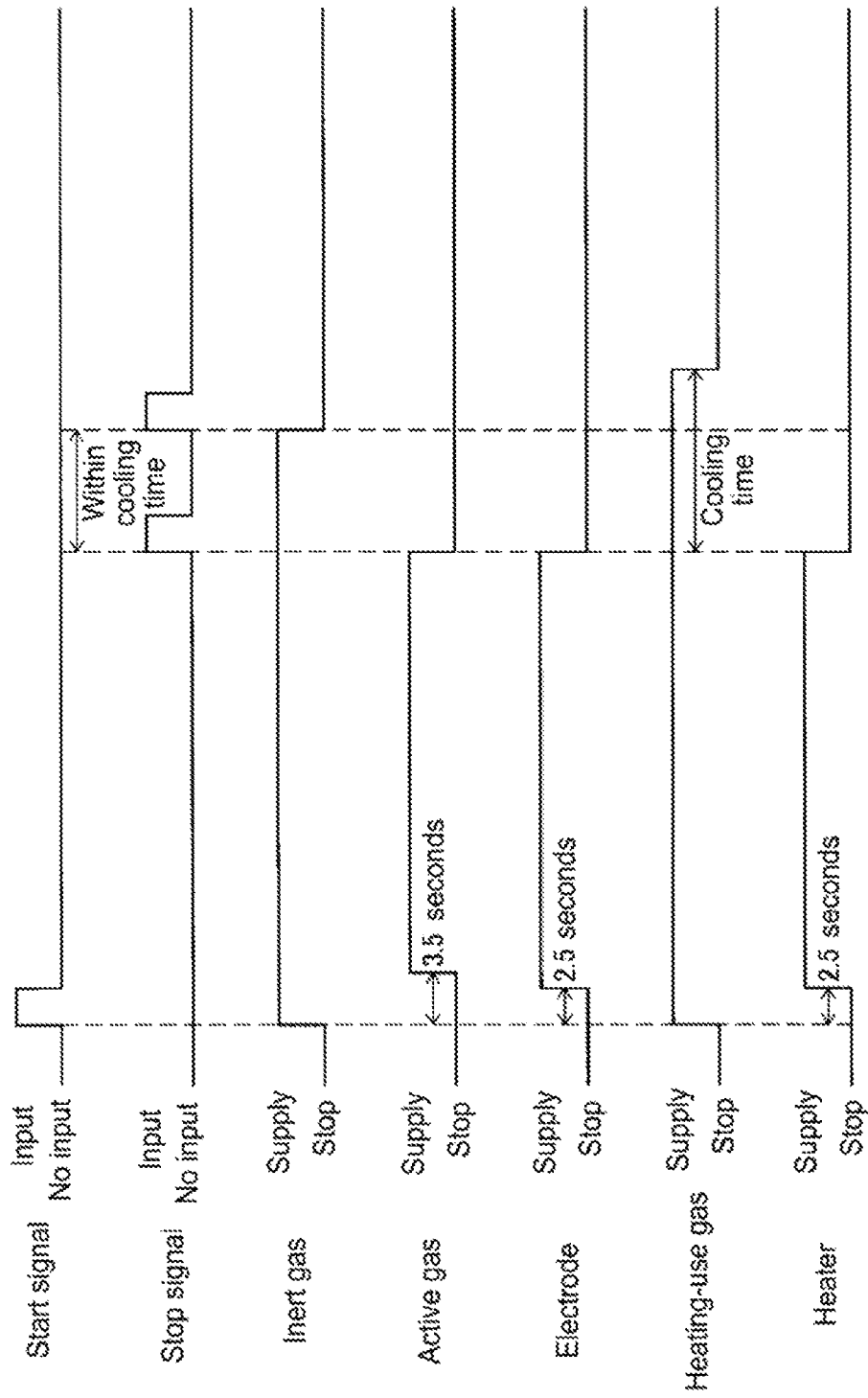
FIG. 11 is a timing chart in standby mode.

However, if the supply of heating-use gas is stopped before the standby time has elapsed after the stop button has been operated and the time until the stop button is operated again is shorter than the cooling time, there is a worry that gas tube 82 cannot be properly cooled. Therefore, when the time until the stop button is operated again is shorter than the cooling time before the standby time has elapsed after the stop button is operated, only the supply of inert gas is stopped at the time when the stop button is operated again. That is, as shown in FIG. 11, when the time from the receiving of the stop signal for the first time to the receiving of the stop signal for the second time before the elapse of the standby time is shorter than the cooling time, only the supply of inert gas is stopped at the time of the receiving of the stop signal for the second time. Then, the supply of heating-use gas is stopped at the time when the cooling time has elapsed since the first stop signal was received. This makes it possible to properly cool gas tube 82.

Note that, in an embodiment above, atmospheric pressure plasma generation device 10 is an example of a plasma generation device. Heated gas ejecting device 14 is an example of a heated gas ejecting device. Control device 16 is an example of a control device. Electrodes 24 and 26 are examples of an electrode. Reaction chamber 38 is an example of a reaction chamber. Electric power supply device 73 is an example of an electric power supply device. Processing gas supply device 74 is an example of a processing gas supply device. Inert gas supply device 76 is an example of an inert gas supply device. Active gas supply device 78 is an example of an active gas supply device. Heater 83 is an example of a heater. Heating-use gas supply device 86 is an example of a heating-use gas supply device. Further, the normal mode is an example of a first operation mode. The standby mode is an example of a second operation mode.

Figure 12:
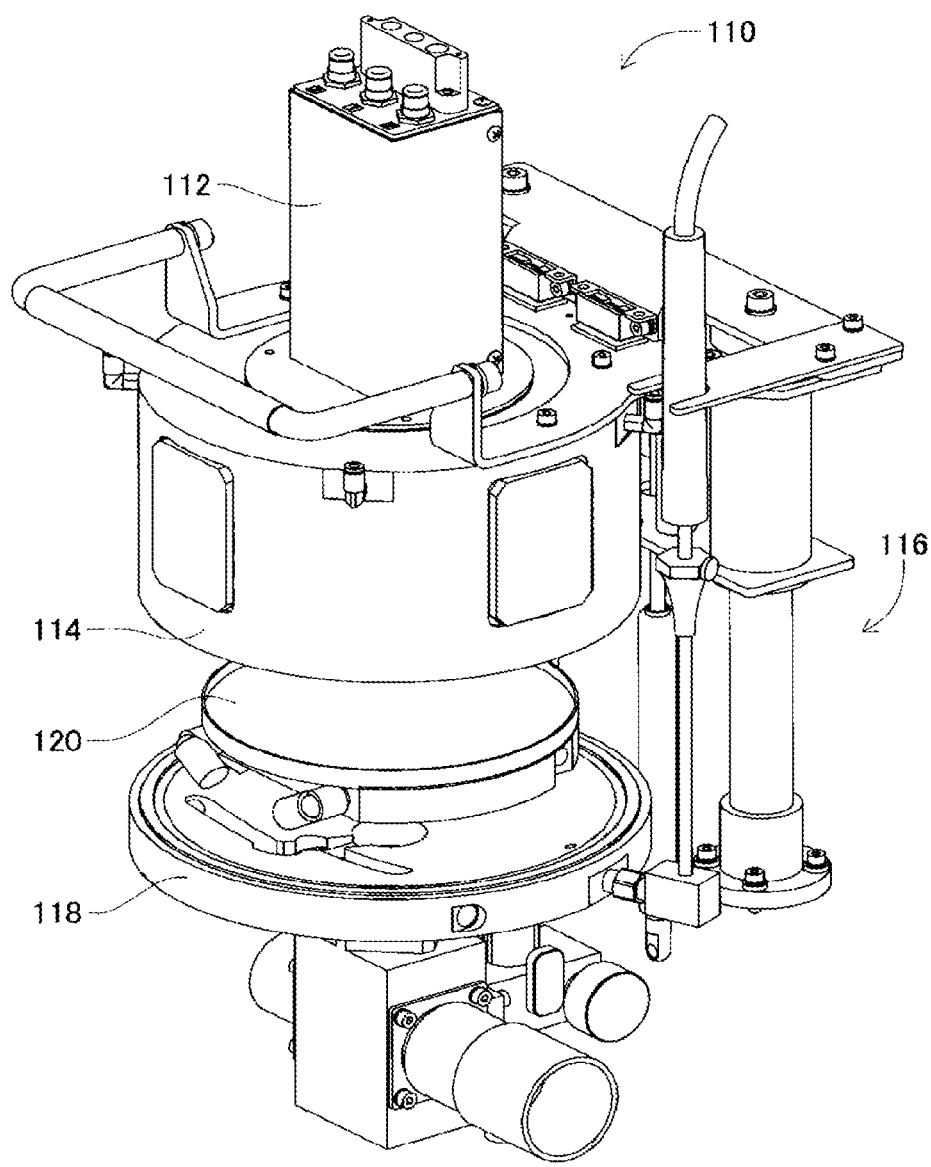
FIG. 12 is a perspective view of an alternative embodiment of a plasma generation device.

Further, the present disclosure is not limited to the above example embodiments, and various changed or improved methods of embodiment are possible based on the knowledge of someone skilled in the art. Specifically, for example, although the present disclosure is applied to atmospheric pressure plasma generation device 10 in an above-described embodiment, the present disclosure may be applied to plasma generation devices having various structures. Specifically, for example, the disclosure may be applied to plasma generation device 110 shown in FIG. 12.

Plasma generation device 110 includes plasma gas emitting device 112, upper cover 114, slide mechanism 116, and lower cover 118. Plasma gas emitting device 112 has substantially the same configuration as plasma gas emitting device 12. Upper cover 114 has a substantially closed cylindrical shape, and is slidably held in the vertical direction by slide mechanism 116. A through-hole (not shown) having a shape corresponding to plasma gas emitting device 112 is formed in the lid portion of upper cover 114. Plasma generation device 110 is fixed in an upright state to a lid section of upper cover 114 so as to cover the through hole. Therefore, the lower end portion of plasma gas emitting device 112 protrudes toward the inside of upper cover 114. Thus, plasma gas emitted by plasma gas emitting device 112 is emitted toward the inside of upper cover 114. Further, lower cover 118 is generally disk-shaped, and the outer diameter of lower cover 118 is larger than the outer diameter of upper cover 114. Also, by sliding upper cover 114 downward using slide mechanism 116, the lower end of upper cover 114 comes into close contact with the upper surface of the lower cover 118, such that the inside of upper cover 114 is sealed.

With such a structure, with plasma generation device 110, dish 120 or the like for accommodating liquid is placed on the upper surface of lower cover 118, and upper cover 114 is closely adhered to the lower cover 118. Thus, by plasma gas being ejected by plasma gas ejecting device 112, plasma processing is performed on the liquid stored in dish 120. Note that, with plasma generation device 110, operation of plasma gas emitting device 112 is controlled in a similar manner to plasma gas emitting device 12. As a result, the same effect as that of atmospheric pressure plasma generation device 10 can be achieved with plasma generation device 110.

Further, in an above embodiment, in the standby mode, when the stop button is operated, inert gas continues to be supplied and the supply of the active gas is stopped, but when the stop button is operated, inert gas and active gas may be continued to be supplied.

Further, in an above embodiment, nitrogen or the like is used as an example of an inert gas, and oxygen or the like is used as an example of an active gas, but dry air may be used for either of these.

Further, in an above embodiment, it is desirable to maintain the flow rate when continuing the flow of the processing gas or the like.

REFERENCE SIGNS LIST

10: atmospheric pressure plasma generation device (plasma generation device);
14: heated gas ejecting device;
16: control device;
24: electrode;
26: electrode;
38: reaction chamber;
73: electric power supply device;
74: processing gas supply device;
76: inert gas supply device;
78: active gas supply device;
83: heater;
86: heating-use gas supply device;
110: plasma generation device

The invention claimed is:

1. A plasma generation device comprising:
an electric power supply device configured to supply electric power to multiple electrodes arranged in a reaction chamber;
a processing gas supply device configured to supply a processing gas to the reaction chamber;
a heated gas ejecting device including a heating-use gas supply device configured to supply a heating-use gas, and a heater configured to heat gas supplied by the heating-use gas supply device, and configured to eject heated gas that was heated by the heater towards a processing body that is a target for application by a plasma generated in the reaction chamber by the electric power supply device; and
a control device configured to control operation of the electric power supply device, the heated gas ejecting device, and the processing gas supply device, wherein
the control device is configured to control the operation of the electric power supply device, the heated gas ejecting device, and the processing gas supply device to stop supply of electric power to the electrodes and to stop the heater but continue supply of the processing gas to the reaction chamber and continue supply of the heating-use gas based on a stop instruction, and restart supply of electric power to the electrodes and restart the heater based on a resume instruction.

2. A plasma generation device comprising:
an electric power supply device configured to supply electric power to multiple electrodes arranged in a reaction chamber;
a processing gas supply device configured to supply a processing gas to the reaction chamber; and
a control device configured to control operation of the electric power supply device and the processing gas supply device, wherein
the control device is configured to
control operation of the processing gas supply device and the electric power supply device in either of a first operation mode in which, when a stop signal is received while electric power is being supplied to the electrodes in a state with the processing gas being supplied to the reaction chamber, supply of electric power to the electrodes is stopped and supply of the processing gas to the reaction chamber is stopped, and a second operation mode in which supply of electric power to the electrodes is stopped, but the processing gas continues to be supplied to the reaction chamber, determine whether a first predetermined amount of standby time has elapsed after the stop signal is received, and control operation of the processing gas supply device and the electric power supply device to stop supply of the processing gas to the reaction chamber when the start signal is not received before the first predetermined amount of standby time elapses in the second operation mode.

3. The plasma generation device according to claim 2, wherein the control device is configured to control operation of the processing gas supply device and the electric power supply device so as to, when a start signal is received after the stop signal is received, in the first operation mode, supply the processing gas to the reaction chamber at a time at which the start signal was received, and supply electric power to the electrodes after a second predetermined amount of standby time has elapsed from the time at which the start signal was received, and, in the second operation mode, supply electric power to the electrodes at the time at which the start signal was received.

4. The plasma generation device according to claim 2, wherein the processing gas supply device includes an inert gas supply device configured to supply an inert gas and an active gas supply device configured to supply an active gas, and wherein the control device is configured to control operation of the processing gas supply device and the electric power supply device so as to, when the stop signal is received while electric power is being supplied to the electrodes in a state with the inert gas and the active gas being supplied to the reaction chamber, in the second operation mode, stop supply of electric power to the electrodes, and stop supply of the active gas to the processing chamber, but continue supply of the inert gas to the processing chamber.

5. The plasma generation device according to claim 4, wherein the control device is configured to control operation of the processing gas supply device and the electric power supply device so as to, when the start signal is received after the stop signal is received, in the second operation mode, supply electric power to the electrodes at a time at which the start signal was received, and supply the active gas to the reaction chamber after a third predetermined amount of standby time has elapsed from the time at which the start signal was received.

6. The plasma generation device according to claim 2, wherein the plasma generation device is provided with a heated gas ejecting device including a heating-use gas supply device configured to supply a heating-use gas, and a heater configured to heat gas supplied by the heating-use gas supply device, and configured to eject heated gas that was heated by the heater towards a processing body that is a target for application by the plasma generated by the plasma generation device, and the control device is configured to control operation of the electric power supply device, the processing gas supply device, and the heated gas ejecting device so as to, when the stop signal is received while electric power is being supplied to the electrodes and the heated gas is being ejected by the heated gas ejecting device in a state with the processing gas being supplied to the reaction chamber, stop the heating of the gas by the heater at a time at which the stop signal was received, and, in the first operation mode, stop supply of the gas by the heating-use gas supply device after a fourth predetermined amount of standby time has elapsed from the time at which the stop signal was received, and, in the second operation mode, stop supply of gas by the heating-use gas supply device after a fifth predetermined amount of standby time that is longer than the fourth predetermined amount of standby time has elapsed.

7. The plasma generation device according to claim 6, wherein the control device is configured to control operation of the electric power supply device, the processing gas supply device, and the heated gas ejecting device so as to, when the start signal is received after the fourth predetermined amount of standby time has elapsed from when the stop signal was received and before the fifth predetermined amount of standby time has elapsed, in the first operation mode, supply gas using the heating-use gas supply device at a time when the start signal was received, and heat the gas using the heater after a sixth predetermined amount of standby time has elapsed from the time when the start signal was received, and, in the second operation mode, heat the gas using the heater at the time when the start signal was received.

* * * * *